US 6,537,890 B2

(12) United States Patent
Joo et al.

(10) Patent No.: US 6,537,890 B2
(45) Date of Patent: Mar. 25, 2003

(54) POLY-SILICON THIN FILM TRANSISTOR HAVING BACK BIAS EFFECTS AND FABRICATION METHOD THEREOF

(75) Inventors: Seung Ki Joo, Sampoong Apt. 22-201, 1685 Seochoedong, Seocho-ku, Seoul (KR); Ki Bum Kim, Seoul (KR); Yeo Geon Yoon, Seoul (KR)

(73) Assignee: Seung Ki Joo, Seoul (KR)

( * ) Notice: Subject to any disclaimer, the term of this patent is extended or adjusted under 35 U.S.C. 154(b) by 0 days.

(21) Appl. No.: 09/900,905

(22) Filed: Jul. 10, 2001

(65) Prior Publication Data

US 2002/0034842 A1 Mar. 21, 2002

(30) Foreign Application Priority Data

Sep. 15, 2000 (KR) .......................................... 2000-54311

(51) Int. Cl.⁷ ................................................ H01L 21/76
(52) U.S. Cl. ...................... 438/404; 438/403; 438/311
(58) Field of Search ............................... 438/404, 403, 438/152, 311, 151, 800, 412, 405, 406, 407, 408, 409, 410, 411, 149; 257/328, 365, 394, 409; 365/230

(56) References Cited

U.S. PATENT DOCUMENTS

| | | | | |
|---|---|---|---|---|
| 4,912,679 A | * | 3/1990 | Shinoda et al. ............. | 365/230 |
| 5,048,109 A | * | 9/1991 | Shinoda et al. ............. | 365/230 |
| 5,313,088 A | * | 5/1994 | Takahashi et al. .......... | 257/328 |
| 5,561,577 A | * | 10/1996 | Motley ........................ | 361/56 |
| 5,567,550 A | * | 10/1996 | Smayling ..................... | 430/5 |
| 5,605,598 A | * | 2/1997 | Greiff .......................... | 156/630 |
| 5,677,041 A | * | 10/1997 | Smayling ..................... | 257/66 |
| 5,691,089 A | * | 11/1997 | Smayling ..................... | 430/5 |
| 5,760,305 A | * | 6/1998 | Greiff .......................... | 73/514 |
| 6,127,998 A | * | 10/2000 | Ichikawa et al. ........... | 345/100 |
| 6,140,692 A | * | 10/2000 | Sher et al. .................. | 257/330 |
| 6,194,282 B1 | * | 2/2001 | Niimi et al. ................. | 438/404 |
| 6,242,335 B1 | * | 6/2001 | Sher et al. .................. | 438/600 |

* cited by examiner

Primary Examiner—Carl Whitehead, Jr.
Assistant Examiner—Laura M Schillinger
(74) Attorney, Agent, or Firm—Rosenberg, Klein & Lee

(57) ABSTRACT

A poly-silicon (poly-Si) thin film transistor (TFT) having a back bias effect is provided in order to enhance characteristics of a leakage current, a sub-threshold slope, and an on-current. The poly-Si TFT includes a glass substrate, an island type buried electrode pad formed of an conductive material on one side of the glass substrate where the back bias voltage is applied, a buffer layer formed of an insulation material on the whole surface of the glass substrate, and a poly-Si TFT formed on the upper portion of the buffer layer. A method of fabricating the TFT is also provided.

8 Claims, 8 Drawing Sheets

POLY-SILICON THIN FILM TRANSISTOR HAVING BACK BIAS EFFECTS AND FABRICATION METHOD THEREOF

BACKGROUND OF THE INVENTION

1. Field of the Invention

The present invention relates to a poly-silicon (poly-Si) thin film transistor (TFT) having back bias effects and a fabrication method thereof, and more particularly, to a poly-Si TFT and a fabrication method thereof, in which a conducting underlayer or an island type buried electrode pad is formed on the lower portion of the TFT in order to apply a back bias, to thereby enhance characteristics of a leakage current, a sub-threshold slope, and an on-current, and revealing a stable operational performance.

2. Description of the Related Art

In general, a poly-crystalline thin film transistor (TFT) is used as a device for driving an active matrix liquid crystal display (LCD).

By the way, since a LCD uses glass as a substrate, it is required that a crystalline temperature for crystallizing an amorphous silicon film used as an active region into a poly-Si film be lowered.

Recently, a new method called a metal induced lateral crystallization (MILC) method has been developed as a method for crystallizing amorphous silicon deposited by a low-pressure vapor deposition method in order to fabricate a TFT at a low temperature of 500° C. or below.

When an amorphous silicon thin film is crystallized by a thermal treatment, the above method uses a silicide reaction between an amorphous silicon and a metal such as nickel (Ni), to thereby obtain an excellent poly-Si TFT of a large crystal particle under the temperature of 500° C. or below.

The above conventional poly-Si TFT fabricated by the Ni Offset and the MILC method has an excellent transistor characteristic.

However, in the result of measuring the transistor characteristic, the TFT reveals a leakage current value of $\sim 10^{-7}$ A/$\mu$m in the case that a gate voltage is 0V and when a drain voltage is high, that is, $V_{DS} > 10V$.

This value is a leakage current value larger by about one-thousand times as $\sim 10^{-10}$ A/$\mu$m which requires to drive an active matrix liquid crystal display (AM-LCD) using a poly-Si TFT.

Thus, it is essential to fabricate a transistor having a lower leakage current characteristic in order to apply a transistor fabricated by the MILC.

Also, since a voltage is not applied to a channel region of a device in the case of a transistor formed on an insulation substrate as in a poly-Si TFT, a device operational performance is degenerated.

SUMMARY OF THE INVENTION

To solve the above problems, it is an object of the present invention to provide a poly-Si TFT and a fabrication method thereof, in which a conducting underlayer is provided in the entire lower portion of a transistor when a poly-Si TFT is fabricated, and thus a transistor leakage current characteristic is enhanced by applying a back bias voltage to the TFT.

It is another object of the present invention to provide a poly-Si TFT and a fabrication method thereof, in which a buried electrode pad for applying a back bias is provided in the lower portion of a transistor channel region, and thus a transistor leakage current characteristic and a sub-threshold slope are further enhanced.

It is another object of the present invention to provide a double gate type poly-Si TFT and a fabrication method thereof, in which a buried type lower gate pad is provided in the lower portion of a transistor channel region, and thus a transistor leakage current characteristic, a sub-threshold slope and an on-current characteristic are further enhanced.

To accomplish the above object of the present invention, there is provided a method of fabricating a poly-Si TFT having back bias effects, the poly-Si TFT fabrication method comprising the steps of: (a) forming a conducting underlayer to which a back bias voltage is applied by using a conductive material on the entire surface of one side of a glass substrate; (b) forming a buffer layer by using an insulation material on the upper portion of the conducting underlayer; and (c) forming a poly-Si TFT on the upper portion of the buffer layer.

The conducting underlayer is made of either a metal thin film or an impurity doped silicon thin film. The metal film used as the conducting underlayer is preferably a molybdenum (Mo) thin film.

The buffer layer may be made of a silicon oxide film formed by an electromagnetic resonance plasma enhanced chemical vapor deposition method.

The poly-Si TFT forming step (c) comprises a step of forming an active region by crystallizing an amorphous silicon. The crystallization method is made of a metal induced lateral crystallization method (MILC) method.

Further, the present invention further comprises a step of patterning the conducting underlayer in the same manner as that of the gate pattern of the thin film transistor, to thereby form an island type buried electrode pad to which aback bias is applied. Accordingly, the back bias is locally applied to the channel region of the obtained TFT.

The poly-Si TFT forming step (c) also comprises the steps of: (c1) depositing and patterning an amorphous silicon to form an active region; (c2) depositing a gate insulation film and a conducting film on the amorphous silicon and then etching the result to form a gate and a gate insulation film; (c3) depositing a nickel layer to the position where the source region and the drain region of the transistor are positioned on the amorphous silicon layer, and injecting impurities in order to define source and drain regions; (c4) thermally treating the result after injecting the impurities and changing the amorphous silicon portion where the nickel layer is deposited into a region crystallized by a metal induced crystallization (MIC) method, and changing the portion where the impurities are injected into a region crystallized by metal induced lateral crystallization (MILC) method; and (c5) forming gate, source and drain electrodes in the gate, source and drain regions, respectively, and connecting the conducting underlayer with a back bias electrode for applying a back bias voltage ($V_{backbias}$).

According to another aspect of the present invention, there is also provided a poly-Si TFT having back bias effects, the poly-Si TFT comprising: a glass substrate; a conducting underlayer formed of a conductive material on the entire surface of one side of the glass substrate where the back bias voltage is applied; a buffer layer formed of an insulation material on the upper portion of the conducting underlayer; and a poly-Si TFT formed on the upper portion of the buffer layer.

The TFT can increase an operational current of the transistor and reduce a leakage current by applying a negative voltage to an electrode connected to the conducting underlayer.

There is also provided a poly-Si TFT having back bias effects, the poly-Si TFT comprising: a glass substrate; an island type buried electrode pad formed of a conductive material on one side of the glass substrate where the back bias voltage is applied; a buffer layer formed of an insulation material on the entire surface of the glass substrate; and a poly-Si TFT formed on the upper portion of the buffer layer.

In this case, a negative back bias is applied to the buried electrode pad, to thereby interrupt an N-type channel from forming due to a back surface defect.

Also, an electrode is formed so that a voltage equal to the gate voltage of a TFT is applied to the buried electrode pad as a back bias, to thereby obtain a double gate TFT.

According to still another aspect of the present invention, there is also provided a double gate type TFT comprising: a glass substrate; a buried type lower gate pad for applying a back bias voltage on one side of the glass substrate; a buffer layer formed of an insulation material on the entire surface of the glass substrate; an active region formed of a poly-Si TFT on the upper portion of the buffer layer; source and drain regions which are formed on both sides of the active region, respectively; a gate oxide film formed on the upper portion of the channel region between the source and drain regions; and an upper gate formed on the upper portion of the gate oxide film, wherein an identical gate voltage is applied to both the upper gate and the buried type lower gate pad.

As described above, the present invention forms a conducting underlayer for applying a back bias on the lower portion of the transistor, to thereby apply a negative back bias to the conducting underlayer, so that an N type channel is prevented from forming due to a back surface defect. Accordingly, a leakage current, a sub-threshold slope, and an operational characteristic of a transistor can be enhanced. Also, a back bias voltage is adjusted so that a variety of transistor characteristics can be implemented.

BRIEF DESCRIPTION OF THE DRAWINGS

The above objects and other advantages of the present invention will become more apparent by describing the preferred embodiments thereof in more detail with reference to the accompanying drawings in which.

DETAILED DESCRIPTION OF THE INVENTION

Preferred embodiments of the present invention will be described with reference to the accompanying drawings.

FIGS. 1A through 1F illustrate sectional views for explaining a poly-silicon (poly-Si) thin film transistor (TFT) fabrication method having a conducting underlayer on the lower surface of a transistor according to a first embodiment of the present invention.

A TFT fabrication method according to a first embodiment of the present invention has been described as an example that a TFT is fabricated using a metal induced lateral crystallization (MILC) method as in the conventional art. However, the present invention is not limited in the above-described embodiment. It should be understood that the present invention can be applied to a TFT which can be fabricated in other methods.

Figure 1A:
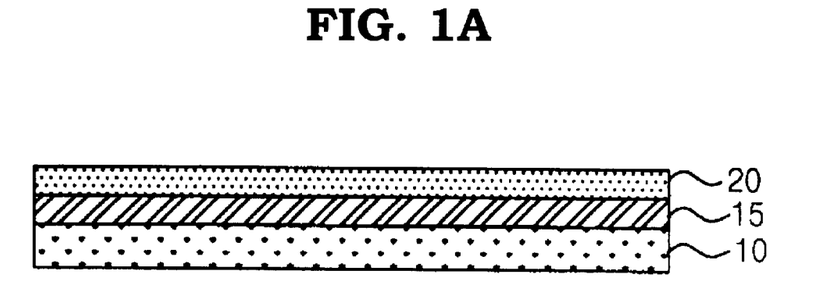
FIGS. 1A through 1F illustrate sectional views for explaining a poly-Si TFT fabrication method having a conducting underlayer on the lower surface of a transistor according to a first embodiment of the present invention.

Referring to FIG. 1A, in the case of a poly-Si TFT according to the first embodiment of the present invention, a molybdenum (Mo) thin film of 1000 Å thick is deposited on a glass substrate (product name: Corning 7059) 10 by a sputtering method, to thereby form a back bias voltage application conducting underlayer 15. Then, a silicon oxide film ($SiO_2$) of 100~10000 Å thick is deposited on the conducting underlayer 10 by an electron cyclotron resonance plasma enhanced chemical vapor deposition (ECR PECVD) method, to thereby form an insulation film 20 used as a buffer layer.

Here, it is possible to use a $PH_3$ doped poly-Si film of 1000 Å thick as the conducting underlayer 15. Also, the thickness of the silicon oxide film ($SiO_2$) used as the insulation film 20 is appropriately 3000 Å or so.

Figure 1B:
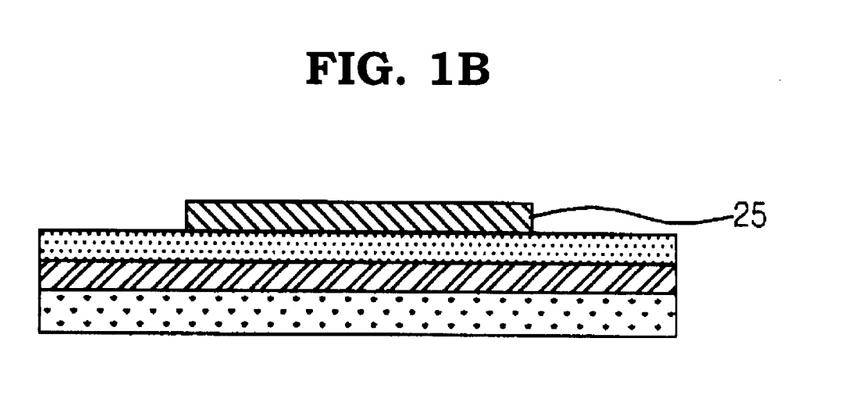

As shown in FIG. 1B, an amorphous silicon (a-Si) of 1000 Å thick is deposited on the entire upper surface of the insulation film 20 by a PECVD method, and then a pattern is formed by a photolithographic etching method, to thereby form the active region 25.

Then, on the amorphous silicon film constituting the active region 25 is formed a silicon oxide film ($SiO_2$) of 100~10000 Å thick which is used as a gate insulation film by an ECR PECVD method. Then, in order to form a gate region of the transistor, a Mo film of 3000 Å thick is deposited using a sputtering device.

Figure 1C:
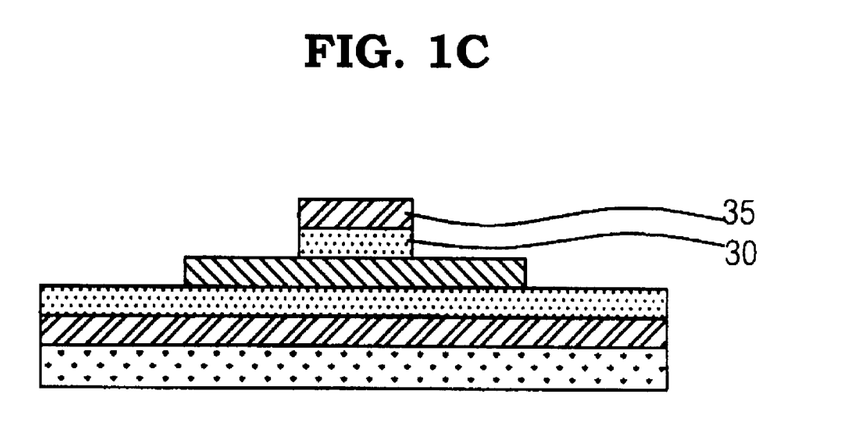

Then, an etching mask necessary for patterning the Mo film and the silicon oxide film by the photolithographic method is formed, and a gate 35 and a gate oxide film 30 are formed by using a dry etching method using a $SF_6$ gas and a wet etching method using a BHF solution, respectively, as shown in FIG. 1C.

Figure 1D:
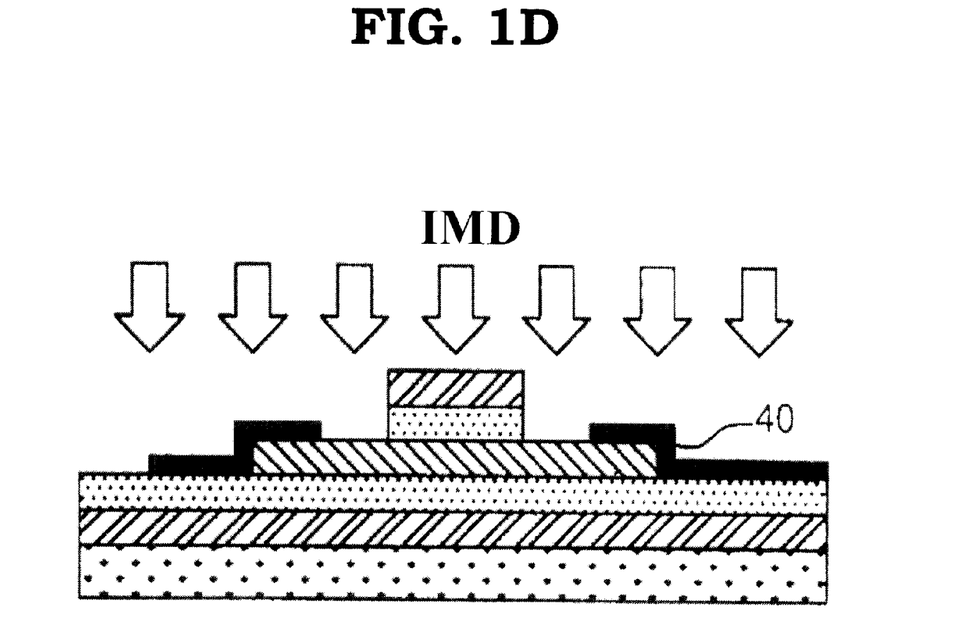

Thereafter, for nickel offset, a photoresist (PR) pattern which is wider by 1~10 μm wide than that of the gate 35, is formed on the upper portion of the gate 35 by a photolithographic etching process. Then, a nickel layer of several tens Å is deposited on the entire surface of the substrate and the nickel layer is removed from the upper portion of the PR pattern by a lift-off method. Then, as shown in FIG. 1D, $PH_3$ impurities are injected into a remaining nickel pattern 40 which is used as an ion injection mask by an ion mass doping device, to thereby form source and drain regions.

Figure 1E:
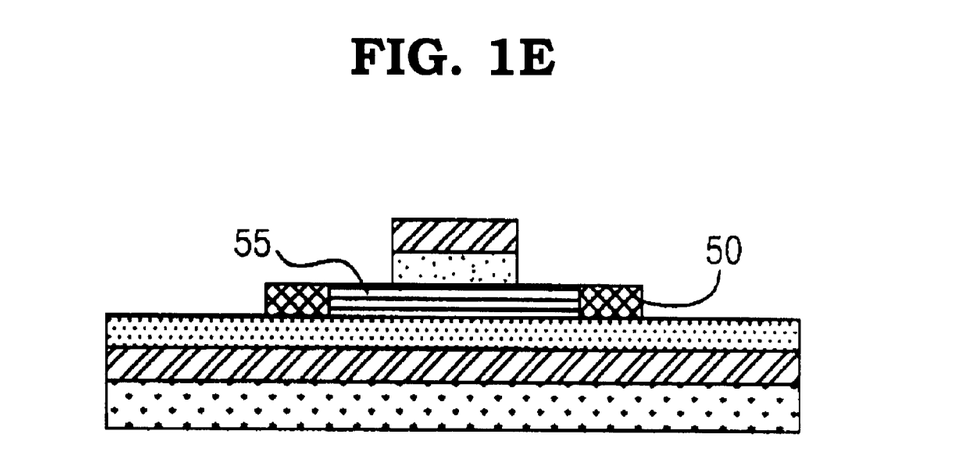

Then, if the resultant product is thermally treated at 500° C. temperature for about ten hours, a lower portion where the nickel pattern 40 has been deposited is changed into a crystallization region 50 by a metal induced crystallization (MIC) method and a channel region 25a where the nickel pattern 40 is not deposited is changed into a crystallization region 55 by a metal induced lateral crystallization (MILC) method, among an active region constituted by the amorphous silicon, as shown in FIG. 1E.

The metal film used for the MIC and MILC of the amorphous silicon film is comprised of any one of Fe, Co, Ru, Rh, Pd, Os, Ir, Pt, Sc, Ti, V, Cr, Mn, Cu, Zn, Au, Ag or an alloy thereof including Ni.

Figure 1F:
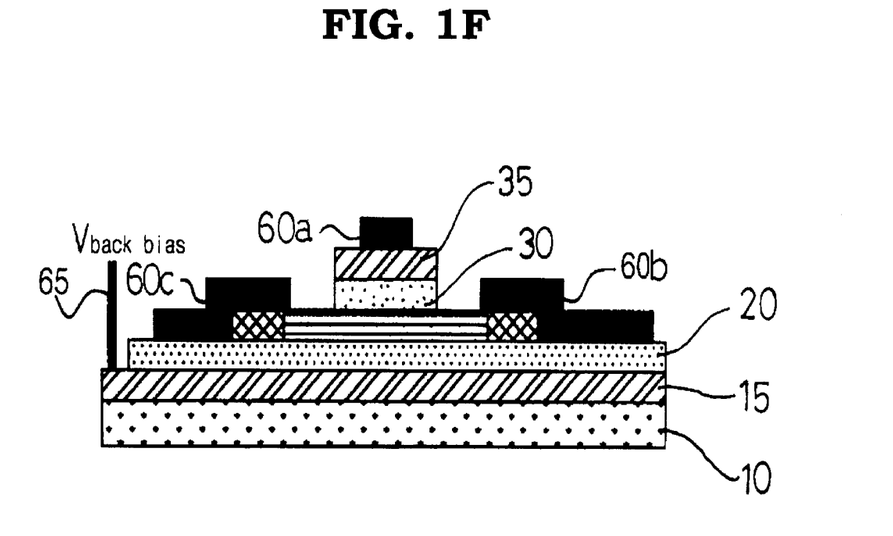

As shown in FIG. 1F, gate, drain and source electrodes 60a–60c are formed on the structure fabricated by the above process, by using aluminum, and a back bias electrode 65 for applying a back bias voltage ($V_{backbias}$) is connected with the conducting underlayer 15, to thereby complete a poly-Si TFT.

The poly-Si TFT according to the present invention constructed as described above reveals an enhancement of the characteristics by which an operational current is increased and a leakage current is reduced.

To ascertain these characteristics of the present invention, the characteristics of the TFT according to the present invention have been investigated.

Figure 2:
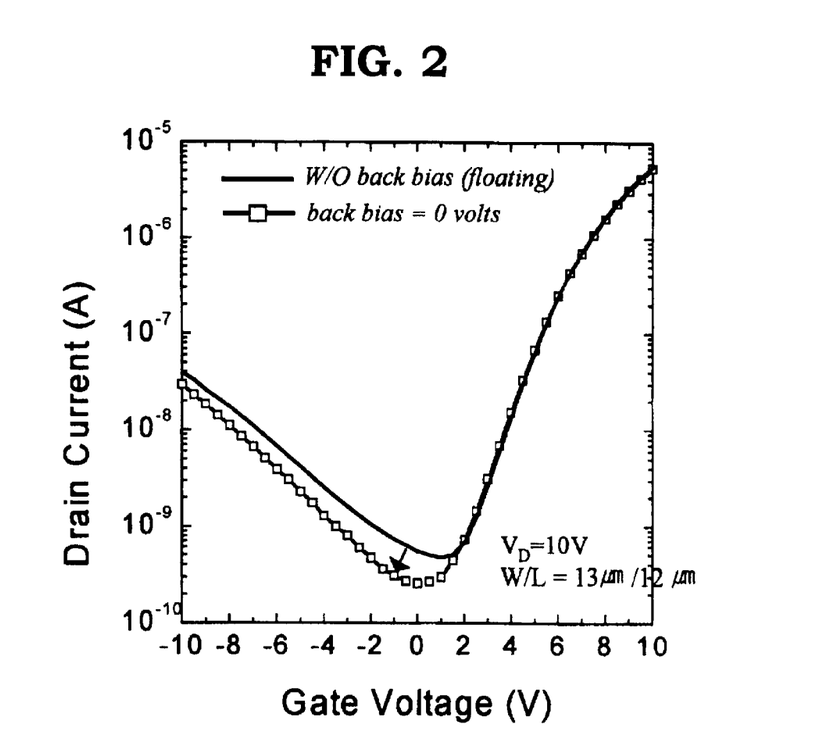
FIG. 2 is a graphical view for explaining the I-V characteristic of a poly-Si TFT according to presence or absence of a conducting underlayer for applying a back bias voltage.

FIG. 2 is a graphical view for explaining the operational characteristic of a poly-Si TFT according to presence or absence of a conducting underlayer when a drain voltage ($V_D$) is 10V. In FIG. 1, a curve plotted by a solid line (-) represents the I-V characteristics of the poly-Si TFT fabricated by using the existing nickel offset and a curve plotted by a patterned line (-□-) represents the I-V characteristics of the poly-Si TFT according to the present invention.

Referring to FIG. 2, the poly-Si TFT according to the present invention forms the conducting underlayer 15 on the lower portion even in the case that there is no back bias, that is, $V_{backbias}$=0V, to thereby increase an operational current of the TFT by ten times from $10^{-5}$ A to $10^{-4}$ A in comparison with the case that there is no conducting underlayer. Also, a sub-threshold slope is improved and a leakage current is reduced somewhat.

That is, if 0~(+)7V is applied as a positive back bias and 0~(-)10V is applied as a negative back bias in the case that $V_D$=10V, and a threshold voltage is 4.5V, a significant change of the sub-threshold current has been observed in the vicinity of the portion where $V_G$=0V.

That is, a sub-threshold current of the TFT having a back bias has greatly increased in contrast to a bulk MOSFET. The reason is because a back channel is formed by a positive back bias to thus assist a source-drain current to flow easily. This current is a diffusion current due to an electron density difference at the source and drain since it is not sufficient to form an inversion layer having a strong back bias. An increase of the sub-threshold current at the positive back bias is due to the fact that a weak inversion layer is formed in the back channel. As a result, as illustrated in FIG. 2, the minimum leakage current of the case that $V_{backbias}$=0V is lower than the conventional case having no conducting underlayer.

However, the sub-threshold current in the case of the negative bias greatly increases differently from the positive back bias. The formation of the weak inversion layer due to holes in the back channel does not play an important role in a N-type transistor. As a result, an increase in a small amount of the sub-threshold current has been observed.

Figure 3:
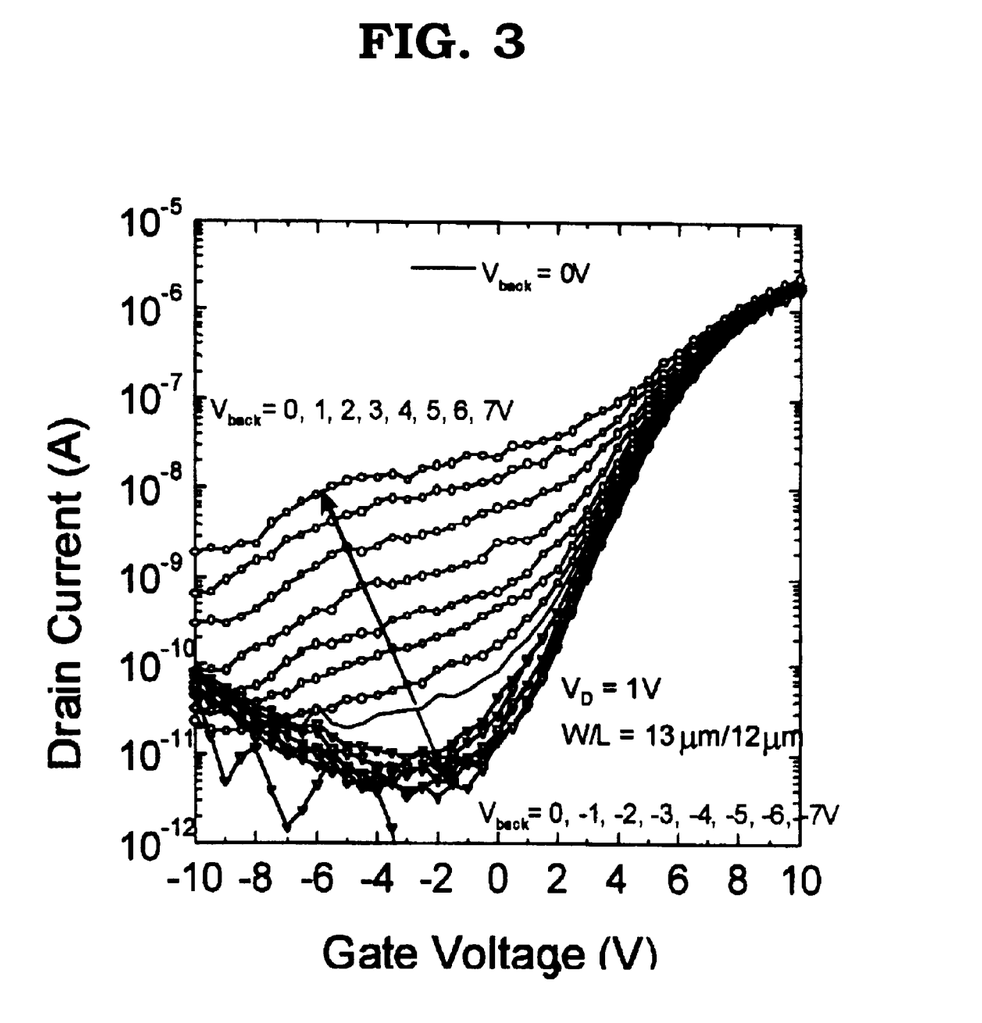
FIG. 3 is a graphical view for explaining the I-V characteristic of a poly-Si TFT according to magnitude of a back bias voltage.

FIG. 3 is a graphical view for explaining the operational characteristic of a poly-Si TFT according to a voltage which is applied to a conducting underlayer. In FIG. 3, a patterned curve plotted by -○- represents the I-V characteristics in the case that the positive back bias is applied, a patterned curve of -▽- represents the I-V characteristics in the case that the negative back bias is applied, and a solid curve represents the I-V characteristics in the case that $V_{backbias}$=0V.

As shown in FIG. 3, when the positive voltage is applied, an on-current increases, but a leakage current sharply increases. Thus, an operational characteristic of a transistor becomes weak. Meanwhile, when the negative voltage is applied, a leakage current is decreases, but an on-current somewhat decreases.

Meanwhile, FIGS. 4A through 4F illustrate sectional views for explaining a poly-Si TFT fabrication method having an island type conducting buried electrode pad on the lower surface of a transistor according to a second embodiment of the present invention.

Figure 4A:
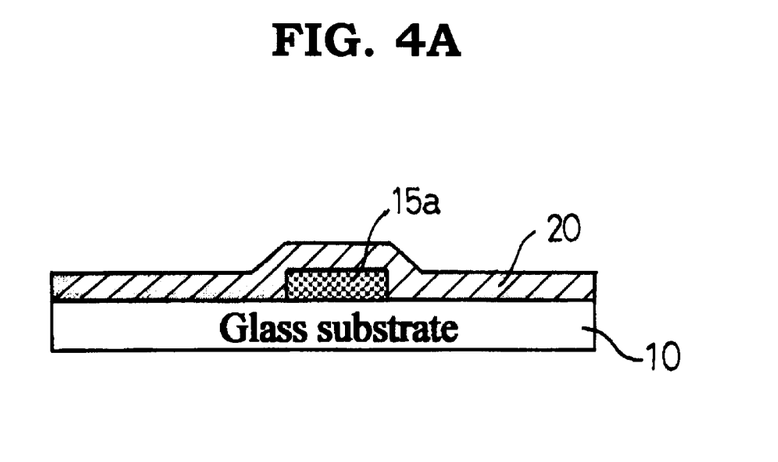
FIGS. 4A through 4F illustrate sectional views for explaining a poly-Si TFT fabrication method having a conducting buried electrode pad on the lower surface of a transistor according to a second embodiment of the present invention.
Figure 4B:
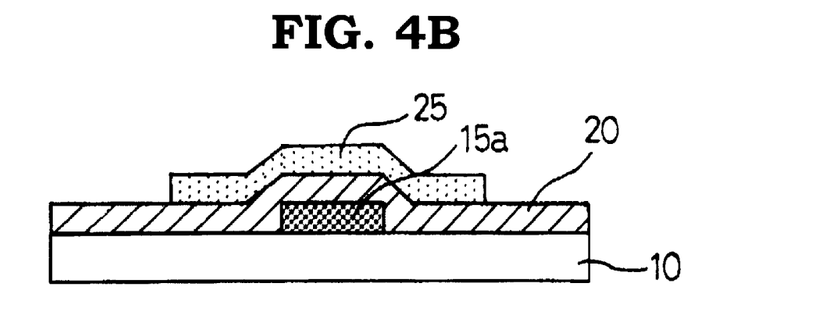
Figure 4C:
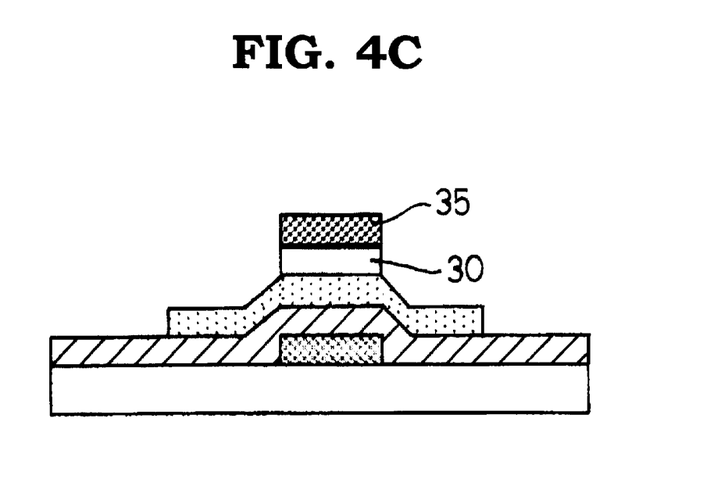
Figure 4D:
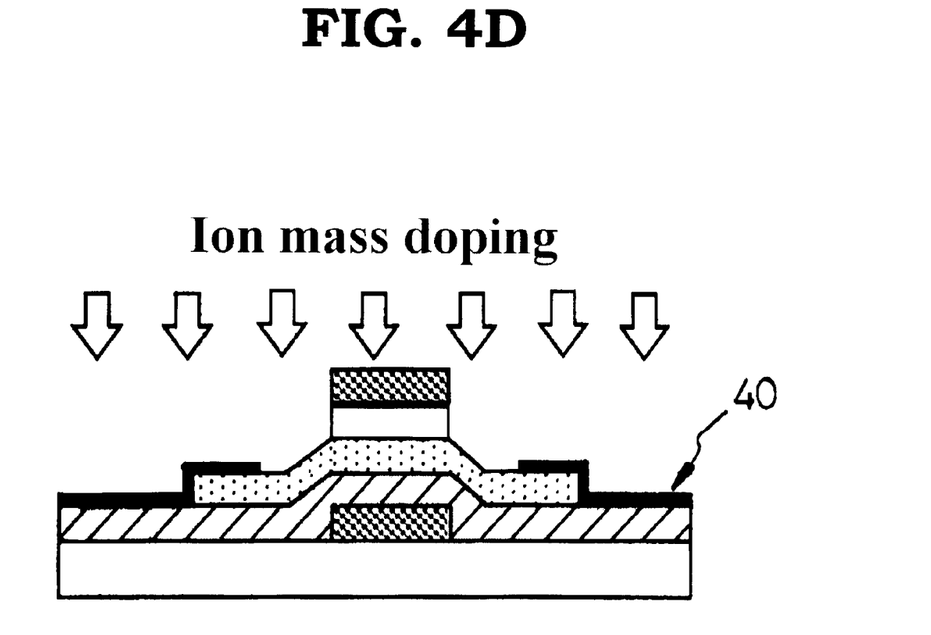
Figure 4E:
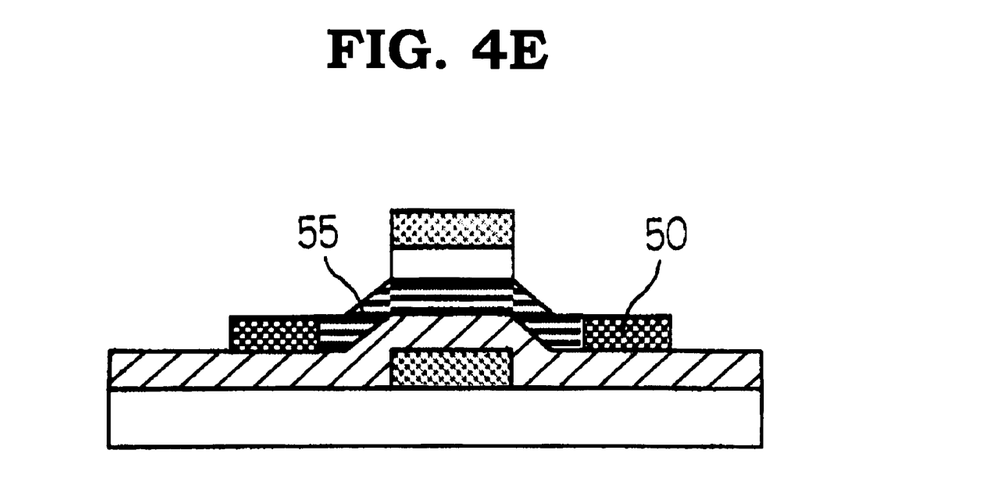

In a poly-Si TFT according to the second embodiment of the present invention, a molybdenum (Mo) thin film of 1000 Å thick is deposited on a glass substrate 10 as a conducting film as shown in FIG. 4A. Then, the resultant product is patterned in the same pattern as that of a gate pattern to thereby form an island type conducting buried electrode pad 15a for applying a back bias. Then, a silicon oxide film ($SiO_2$) 20 of 100~10000 Å thick which is used as a buffer layer is deposited on the buried electrode pad 15a by an electromagnetic resonance plasma enhanced chemical vapor deposition (ECR PECVD) method.

Thereafter, since the FIGS. 4B through 4F processes are same as those of the FIGS. 1B through 1F, the detailed description thereof will not be omitted.

Figure 4F:
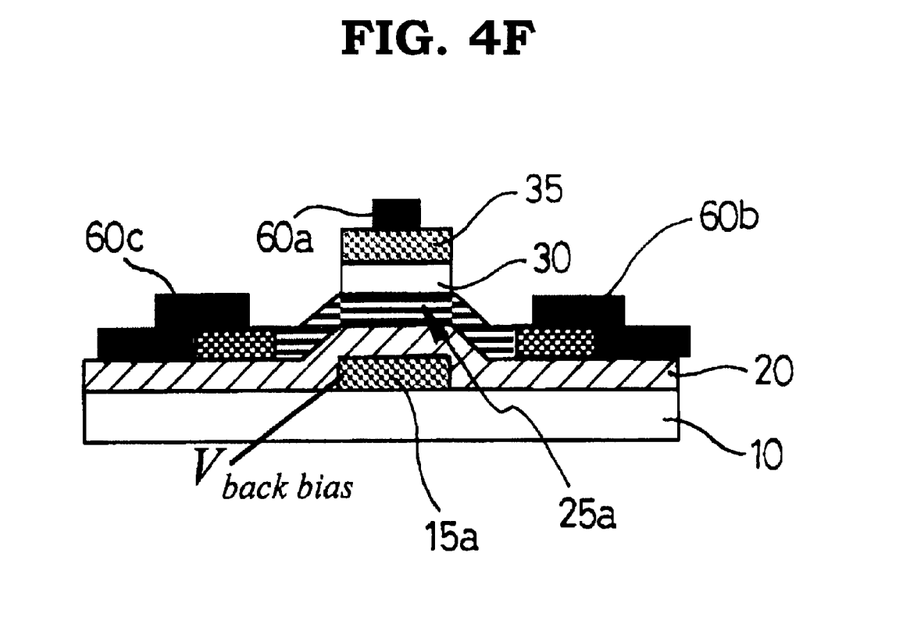

When these processes proceed completely, a poly-Si TFT is completed where the conducting buried electrode pad 15a for applying a back bias voltage is formed only on the lower portion of a transistor channel region 25a as shown in FIG. 4F.

Thus, in the case of the poly-Si TFT according to the second embodiment of the present invention constructed as described above, the conducting buried electrode pad 15a for applying a back bias voltage is formed on only the lower portion of the channel region 25a. As a result, when a back bias of –10V~0V is applied, a N-type channel is prevented from being formed in the channel region 25a due to a back surface defect. Accordingly, the second embodiment has a great effect that a leakage current is further reduced, and a sub-threshold slope is enhanced.

Figure 5:
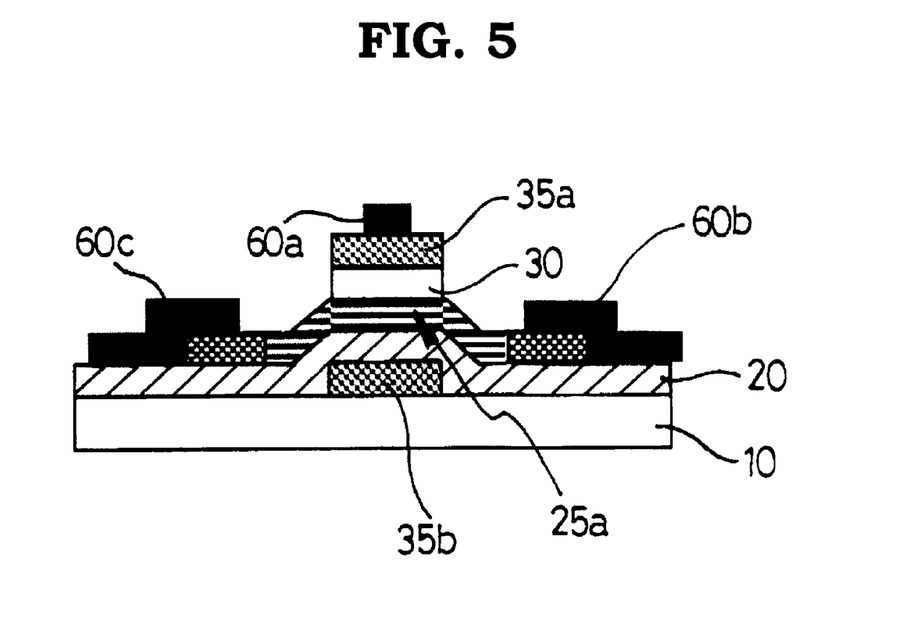
FIG. 5 is a sectional view showing a double gate type poly-Si TFT using a buried electrode pad according to a second embodiment of the present invention.

Also, FIG. 5 shows a structure where a double gate type poly-Si TFT together with an upper gate 35a positioned on the upper portion of a gate oxide film 30, in which a buried electrode pad is used as lower gate 35b in the second embodiment.

In the double gate type TFT, a voltage which is same as that a gate voltage ($V_D$) applied to the upper gate 35a is applied to the lower gate 35b as a back bias voltage, to thereby drive the TFT.

Figure 6:
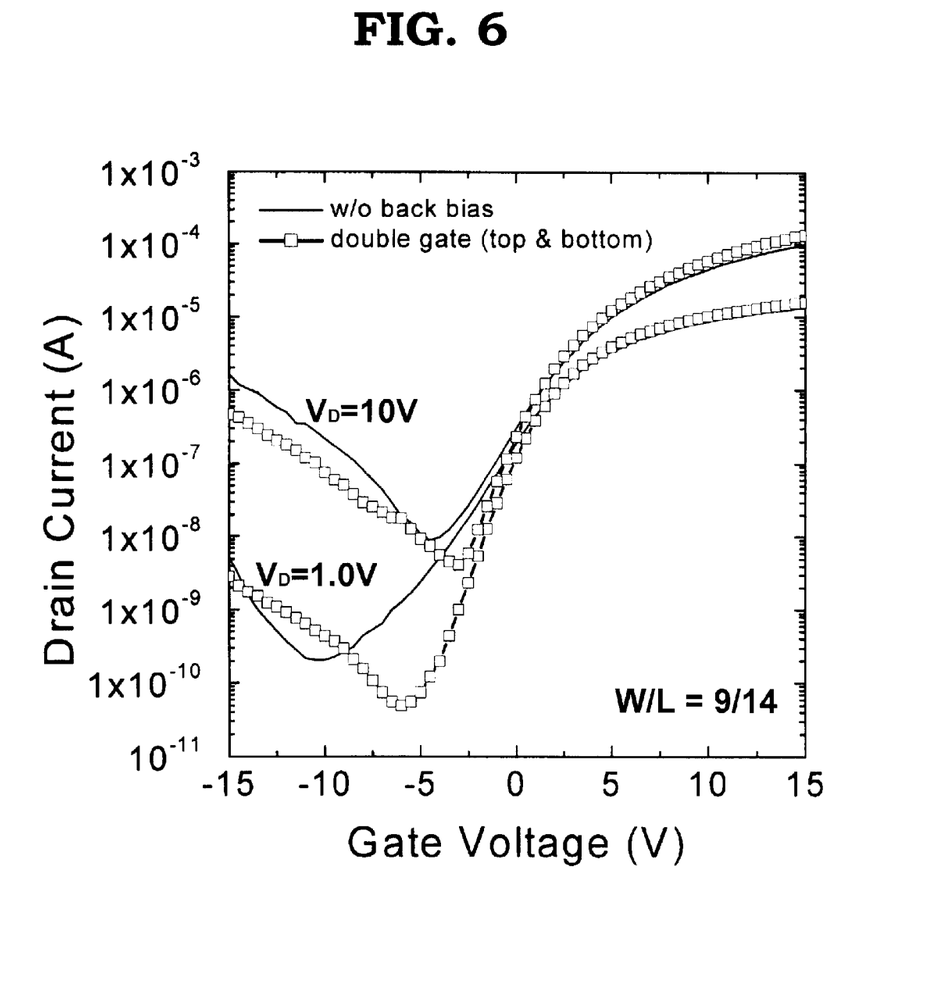
FIG. 6 is a graphical view for explaining the I-V characteristic of the double gate type poly-Si TFT of FIG. 5.

FIG. 6 is a graphical view for explaining the I-V characteristic of the double gate type poly-Si TFT of FIG. 5. Here, in the case that $V_D$=1.0V and $V_D$=10V, a characteristic curve (-) shows the conventional case where there is no back bias, and a characteristic curve (□) shows the case where the same voltage as the gate voltage is applied as a back bias voltage.

As shown in FIG. 6, in the case of the double gate type poly-Si TFT according to the present invention, a leakage current is reduced, a sub-threshold slop is enhanced about two times, and an on-current is increased.

The enhancement of the leakage current and the sub-threshold slop is achieved because of prevention of an N-type channel from being formed due to a back surface defect, as in the first embodiment.

Also, the magnitude of the on-current which can flow is increased because an inversion layer which is formed by the upper gate voltage is formed in a back channel by even a back gate bias.

Meanwhile, a conducting underlayer (Mo) is formed below the TFT device in the first embodiment, to thereby reduce an aperture ratio when the TFT is applied in a LCD device, in which case reduction of the aperture ratio reduces brightness of a screen. However, in the case that a conducting buried electrode pad coincides with a gate pattern, a demerit that an aperture ratio of a screen can be reduced can be avoided.

The above-described embodiments have been described with respect to the processes which use a MILC in the crystallization of an amorphous silicon which is used as an active region of the TFT. However, it should be understood that the present invention can be also applied to the case that other processes are used.

Also, the present invention can be applied to a TFT having any type of structures by a person who has an ordinary skill in the art. There are many modifications within the scope of the present invention.

As described above, in the present invention, a conducting underlayer or an island type buried electrode pad for applying a back bias is formed on the lower portion or the channel region of a poly-Si TFT, to thereby enhance a leakage current characteristic and an operational characteristic. Also, a voltage applied to the lower conducting underlayer is adjusted, to thereby realize a variety of transistor characteristics.

As described above, the present invention has been described with respect to the particularly preferred embodiments. However, the present invention is not limited in the above-described embodiments. It is apparent to one who is skilled in the art that there are many variations and modifications, within the technical scope of the appended claims without departing off the spirit of the present invention.

What is claimed is:

1. A poly-silicon (poly-Si) thin film transistor (TFT) having back bias effects, the poly-Si TFT comprising:
   a glass substrate;
   a conducting underlayer formed of a conductive material on the entire surface of one side of the glass substrate in contiguous contact therewith, a back bias voltage being applied to said conducting underlayer;
   a buffer layer formed of an insulation material on the upper portion of the conducting underlayer;
   an active region formed of poly-Si on the upper portion of the buffer layer;
   source and drain regions formed in said active region at opposite sides thereof;
   a gate oxide film formed on the upper portion of said active region between said source and drain regions; and
   a gate formed upon said gate oxide film.

2. The poly-silicon (poly-Si) thin film transistor (TFT) of claim 1, wherein an operational current of the transistor is increased and a leakage current is reduced by applying a negative said back bias voltage to an electrode connected to the conducting underlayer.

3. A poly-silicon (poly-Si) thin film transistor (TFT) having back bias effects, the poly-Si TFT comprising:
   a glass substrate;
   an island type buried electrode pad formed of a conductive material on one side of the glass substrate in contiguous contact therewith, a back bias voltage being applied to said island type buried electrode pad;
   a buffer layer formed of an insulation material on said one side of the glass substrate and over said island type buried electrode pad, said island type buried electrode pad being enveloped by said glass substrate and said buffer layer; and
   a poly-Si TFT formed on the upper portion of the buffer layer, said poly-Si TFT having an active region formed of poly-Si material.

4. The poly-Si TFT of claim 3, wherein a negative said back bias is applied to the island type buried electrode pad, to thereby interrupt formation of an N-type channel due to a back surface defect.

5. The poly-Si TFT of claim 3, wherein said poly-Si TFT further includes a source and a drain formed in said active region, and a gate formed above said active region between said source and said drain;
   said back bias voltage applied to the island type buried electrode pad being substantially equal to a voltage applied to said gate of said poly-Si TFT.

6. The poly-Si TFT of claim 3, wherein the buried electrode pad is formed below the lower side of the active region in the same pattern as the gate pattern of the thin film transistor.

7. A double gate type thin film transistor (TFT), comprising:
   a glass substrate;
   a buried type lower gate pad formed on one side of the glass substrate, a back bias voltage being applied to said buried type lower gate pad;
   a buffer layer formed of an insulation material on said one side of the glass substrate;
   an active region formed of poly-Si on the upper portion of the buffer layer;
   source and drain regions formed on both sides of the active region, respectively;
   a gate oxide film formed on the upper portion of the active region between the source and drain regions; and
   an upper gate formed on the upper portion of the gate oxide film,
   wherein an identical gate voltage is applied to both the upper gate and the buried type lower gate pad.

8. The double gate type thin film transistor (TFT) of claim 7, wherein the buried type lower gate pad is formed in the same pattern as the upper gate.

* * * * *